(12) United States Patent
Khlat

(10) Patent No.: US 8,975,959 B2
(45) Date of Patent: Mar. 10, 2015

(54) MONOTONIC CONVERSION OF RF POWER AMPLIFIER CALIBRATION DATA

(71) Applicant: RF Micro Devices, Inc., Greensboro, NC (US)

(72) Inventor: Nadim Khlat, Cugnaux (FR)

(73) Assignee: RF Micro Devices, Inc., Greensboro, NC (US)

( * ) Notice: Subject to any disclaimer, the term of this patent is extended or adjusted under 35 U.S.C. 154(b) by 39 days.

(21) Appl. No.: 13/684,826

(22) Filed: Nov. 26, 2012

(65) Prior Publication Data

US 2013/0135045 A1  May 30, 2013

Related U.S. Application Data

(60) Provisional application No. 61/565,138, filed on Nov. 30, 2011.

(51) Int. Cl.
*H03G 3/20* (2006.01)
*H03G 1/04* (2006.01)
*H03F 1/02* (2006.01)
*H03F 1/32* (2006.01)

(52) U.S. Cl.
CPC .............. *H03G 1/04* (2013.01); *H03F 1/0227* (2013.01); *H03F 1/3247* (2013.01)
USPC .......................................... 330/136; 330/149

(58) Field of Classification Search
CPC ..................................................... H03F 1/3241
USPC ............................ 330/136, 149, 129; 375/297
See application file for complete search history.

(56) References Cited

U.S. PATENT DOCUMENTS

| | | | |
|---|---|---|---|
| 3,969,682 A | 7/1976 | Rossum | |
| 3,980,964 A | 9/1976 | Grodinsky | |
| 4,587,552 A | 5/1986 | Chin | |
| 4,692,889 A | 9/1987 | McNeely | |
| 4,831,258 A | 5/1989 | Paulk et al. | |
| 4,996,500 A | 2/1991 | Larson et al. | |
| 5,099,203 A | 3/1992 | Weaver et al. | |
| 5,146,504 A | 9/1992 | Pinckley | |
| 5,187,396 A | 2/1993 | Armstrong, II et al. | |
| 5,311,309 A | 5/1994 | Ersoz et al. | |

(Continued)

FOREIGN PATENT DOCUMENTS

| | | |
|---|---|---|
| EP | 0755121 A2 | 1/1997 |
| EP | 1492227 A1 | 12/2004 |

(Continued)

OTHER PUBLICATIONS

Final Office Action for U.S. Appl. No. 13/297,470, mailed Oct. 25, 2013, 17 pages.

(Continued)

*Primary Examiner* — Henry Choe
(74) *Attorney, Agent, or Firm* — Withrow & Terranova, P.L.L.C.

(57) ABSTRACT

Circuitry, which includes data memory and processing circuitry, is disclosed. The data memory is used to store look-up table (LUT)-based radio frequency (RF) power amplifier (PA) calibration data. The processing circuitry converts at least a portion of the LUT-based RF PA calibration data to provide monotonic response curve-based data. As such, a magnitude of an envelope power supply control signal is determined based on a magnitude of an RF input signal using the monotonic response curve-based data.

23 Claims, 11 Drawing Sheets

(56) References Cited

U.S. PATENT DOCUMENTS

| | | |
|---|---|---|
| 5,317,217 A | 5/1994 | Rieger et al. |
| 5,351,087 A | 9/1994 | Christopher et al. |
| 5,414,614 A | 5/1995 | Fette et al. |
| 5,420,643 A | 5/1995 | Romesburg et al. |
| 5,486,871 A | 1/1996 | Filliman et al. |
| 5,532,916 A | 7/1996 | Tamagawa |
| 5,541,547 A | 7/1996 | Lam |
| 5,581,454 A | 12/1996 | Collins |
| 5,646,621 A | 7/1997 | Cabler et al. |
| 5,715,526 A | 2/1998 | Weaver, Jr. et al. |
| 5,767,744 A | 6/1998 | Irwin et al. |
| 5,822,318 A | 10/1998 | Tiedemann, Jr. et al. |
| 5,898,342 A | 4/1999 | Bell |
| 5,905,407 A | 5/1999 | Midya |
| 5,936,464 A | 8/1999 | Grondahl |
| 6,043,610 A | 3/2000 | Buell |
| 6,043,707 A | 3/2000 | Budnik |
| 6,055,168 A | 4/2000 | Kotowski et al. |
| 6,070,181 A | 5/2000 | Yeh |
| 6,118,343 A | 9/2000 | Winslow |
| 6,133,777 A | 10/2000 | Savelli |
| 6,141,541 A | 10/2000 | Midya et al. |
| 6,147,478 A | 11/2000 | Skelton et al. |
| 6,198,645 B1 | 3/2001 | Kotowski et al. |
| 6,204,731 B1 | 3/2001 | Jiang et al. |
| 6,256,482 B1 | 7/2001 | Raab |
| 6,300,826 B1 | 10/2001 | Mathe et al. |
| 6,313,681 B1 | 11/2001 | Yoshikawa |
| 6,348,780 B1 | 2/2002 | Grant |
| 6,483,281 B2 | 11/2002 | Hwang |
| 6,559,689 B1 | 5/2003 | Clark |
| 6,566,935 B1 | 5/2003 | Renous |
| 6,583,610 B2 | 6/2003 | Groom et al. |
| 6,617,930 B2 | 9/2003 | Nitta |
| 6,621,808 B1 | 9/2003 | Sadri |
| 6,624,712 B1 | 9/2003 | Cygan et al. |
| 6,658,445 B1 | 12/2003 | Gau et al. |
| 6,681,101 B1 | 1/2004 | Eidson et al. |
| 6,690,652 B1 | 2/2004 | Sadri |
| 6,701,141 B2 | 3/2004 | Lam |
| 6,703,080 B2 | 3/2004 | Reyzelman et al. |
| 6,728,163 B2 | 4/2004 | Gomm et al. |
| 6,744,151 B2 | 6/2004 | Jackson et al. |
| 6,819,938 B2 | 11/2004 | Sahota |
| 6,958,596 B1 | 10/2005 | Sferrazza et al. |
| 6,995,995 B2 | 2/2006 | Zeng et al. |
| 7,038,536 B2 | 5/2006 | Cioffi et al. |
| 7,043,213 B2 | 5/2006 | Robinson et al. |
| 7,058,373 B2 | 6/2006 | Grigore |
| 7,099,635 B2 | 8/2006 | McCune |
| 7,200,365 B2 | 4/2007 | Watanabe et al. |
| 7,233,130 B1 | 6/2007 | Kay |
| 7,253,589 B1 | 8/2007 | Potanin et al. |
| 7,254,157 B1 | 8/2007 | Crotty et al. |
| 7,279,875 B2 | 10/2007 | Gan et al. |
| 7,394,233 B1 | 7/2008 | Trayling et al. |
| 7,405,618 B2 | 7/2008 | Lee et al. |
| 7,411,316 B2 | 8/2008 | Pai |
| 7,414,330 B2 | 8/2008 | Chen |
| 7,515,885 B2 | 4/2009 | Sander et al. |
| 7,528,807 B2 | 5/2009 | Kim et al. |
| 7,529,523 B1 | 5/2009 | Young et al. |
| 7,539,466 B2 | 5/2009 | Tan et al. |
| 7,595,569 B2 | 9/2009 | Amerom et al. |
| 7,609,114 B2 | 10/2009 | Hsieh et al. |
| 7,615,979 B2 | 11/2009 | Caldwell |
| 7,627,622 B2 | 12/2009 | Conrad et al. |
| 7,646,108 B2 | 1/2010 | Paillet et al. |
| 7,653,366 B2 | 1/2010 | Grigore |
| 7,679,433 B1 | 3/2010 | Li |
| 7,684,216 B2 | 3/2010 | Choi et al. |
| 7,696,735 B2 | 4/2010 | Oraw et al. |
| 7,715,811 B2 | 5/2010 | Kenington |
| 7,724,837 B2 | 5/2010 | Filimonov et al. |
| 7,773,691 B2 | 8/2010 | Khlat et al. |
| 7,777,459 B2 | 8/2010 | Williams |
| 7,782,036 B1 | 8/2010 | Wong et al. |
| 7,783,269 B2 | 8/2010 | Vinayak et al. |
| 7,800,427 B2 | 9/2010 | Chae et al. |
| 7,805,115 B1 | 9/2010 | McMorrow et al. |
| 7,859,336 B2 | 12/2010 | Markowski et al. |
| 7,880,547 B2 | 2/2011 | Lee et al. |
| 7,894,216 B2 | 2/2011 | Melanson |
| 7,898,268 B2 | 3/2011 | Bernardon et al. |
| 7,898,327 B2 | 3/2011 | Nentwig |
| 7,907,010 B2 | 3/2011 | Wendt et al. |
| 7,915,961 B1 | 3/2011 | Li |
| 7,923,974 B2 | 4/2011 | Martin et al. |
| 7,965,140 B2 | 6/2011 | Takahashi |
| 7,994,864 B2 | 8/2011 | Chen et al. |
| 8,000,117 B2 | 8/2011 | Petricek |
| 8,008,970 B1 | 8/2011 | Homol et al. |
| 8,022,761 B2 | 9/2011 | Drogi et al. |
| 8,026,765 B2 | 9/2011 | Giovannotto |
| 8,044,639 B2 | 10/2011 | Tamegai et al. |
| 8,068,622 B2 | 11/2011 | Melanson et al. |
| 8,081,199 B2 | 12/2011 | Takata et al. |
| 8,093,951 B1 | 1/2012 | Zhang et al. |
| 8,159,297 B2 * | 4/2012 | Kumagai ...................... 330/149 |
| 8,164,388 B2 | 4/2012 | Iwamatsu |
| 8,174,313 B2 | 5/2012 | Vice |
| 8,183,917 B2 * | 5/2012 | Drogi et al. .................. 330/129 |
| 8,183,929 B2 | 5/2012 | Grondahl |
| 8,198,941 B2 | 6/2012 | Lesso |
| 8,204,456 B2 | 6/2012 | Xu et al. |
| 8,242,813 B1 | 8/2012 | Wile et al. |
| 8,274,332 B2 | 9/2012 | Cho et al. |
| 8,289,084 B2 | 10/2012 | Morimoto et al. |
| 8,362,837 B2 * | 1/2013 | Koren et al. .................. 330/295 |
| 8,541,993 B2 | 9/2013 | Notman et al. |
| 8,542,061 B2 | 9/2013 | Levesque et al. |
| 8,548,398 B2 | 10/2013 | Baxter et al. |
| 8,558,616 B2 * | 10/2013 | Shizawa et al. ............... 330/149 |
| 8,588,713 B2 | 11/2013 | Khlat |
| 8,611,402 B2 | 12/2013 | Chiron |
| 8,618,868 B2 | 12/2013 | Khlat et al. |
| 8,624,576 B2 | 1/2014 | Khlat et al. |
| 8,624,760 B2 | 1/2014 | Ngo et al. |
| 8,626,091 B2 | 1/2014 | Khlat et al. |
| 8,638,165 B2 | 1/2014 | Shah et al. |
| 8,648,657 B1 | 2/2014 | Rozenblit |
| 8,659,355 B2 | 2/2014 | Henshaw et al. |
| 8,718,582 B2 | 5/2014 | See et al. |
| 2002/0071497 A1 | 6/2002 | Bengtsson et al. |
| 2003/0031271 A1 | 2/2003 | Bozeki et al. |
| 2003/0062950 A1 | 4/2003 | Hamada et al. |
| 2003/0137286 A1 | 7/2003 | Kimball et al. |
| 2003/0198063 A1 | 10/2003 | Smyth |
| 2003/0206603 A1 | 11/2003 | Husted |
| 2003/0220953 A1 | 11/2003 | Allred |
| 2003/0232622 A1 | 12/2003 | Seo et al. |
| 2004/0047329 A1 | 3/2004 | Zheng |
| 2004/0051384 A1 | 3/2004 | Jackson et al. |
| 2004/0124913 A1 | 7/2004 | Midya et al. |
| 2004/0184569 A1 | 9/2004 | Challa et al. |
| 2004/0196095 A1 | 10/2004 | Nonaka |
| 2004/0219891 A1 | 11/2004 | Hadjichristos |
| 2004/0239301 A1 | 12/2004 | Kobayashi |
| 2004/0266366 A1 | 12/2004 | Robinson et al. |
| 2004/0267842 A1 | 12/2004 | Allred |
| 2005/0008093 A1 | 1/2005 | Matsuura et al. |
| 2005/0032499 A1 | 2/2005 | Cho |
| 2005/0047180 A1 | 3/2005 | Kim |
| 2005/0064830 A1 | 3/2005 | Grigore |
| 2005/0093630 A1 | 5/2005 | Whittaker et al. |
| 2005/0110562 A1 | 5/2005 | Robinson et al. |
| 2005/0122171 A1 | 6/2005 | Miki et al. |
| 2005/0156582 A1 | 7/2005 | Redl et al. |
| 2005/0156662 A1 | 7/2005 | Raghupathy et al. |
| 2005/0157778 A1 | 7/2005 | Trachewsky et al. |
| 2005/0200407 A1 | 9/2005 | Arai et al. |
| 2005/0286616 A1 | 12/2005 | Kodavati |
| 2006/0006946 A1 | 1/2006 | Burns et al. |
| 2006/0062324 A1 | 3/2006 | Naito et al. |

(56) References Cited

U.S. PATENT DOCUMENTS

| | | |
|---|---|---|
| 2006/0097711 A1 | 5/2006 | Brandt |
| 2006/0128324 A1 | 6/2006 | Tan et al. |
| 2006/0178119 A1 | 8/2006 | Jarvinen |
| 2006/0181340 A1 | 8/2006 | Dhuyvetter |
| 2006/0220627 A1 | 10/2006 | Koh |
| 2006/0244513 A1 | 11/2006 | Yen et al. |
| 2007/0008804 A1 | 1/2007 | Lu et al. |
| 2007/0014382 A1 | 1/2007 | Shakeshaft et al. |
| 2007/0024360 A1 | 2/2007 | Markowski |
| 2007/0063681 A1 | 3/2007 | Liu |
| 2007/0082622 A1 | 4/2007 | Leinonen et al. |
| 2007/0146076 A1 | 6/2007 | Baba |
| 2007/0182392 A1 | 8/2007 | Nishida |
| 2007/0183532 A1 | 8/2007 | Matero |
| 2007/0259628 A1 | 11/2007 | Carmel et al. |
| 2008/0003950 A1 | 1/2008 | Haapoja et al. |
| 2008/0044041 A1 | 2/2008 | Tucker et al. |
| 2008/0081572 A1 | 4/2008 | Rofougaran |
| 2008/0104432 A1 | 5/2008 | Vinayak et al. |
| 2008/0150619 A1 | 6/2008 | Lesso et al. |
| 2008/0205095 A1 | 8/2008 | Pinon et al. |
| 2008/0242246 A1 | 10/2008 | Minnis et al. |
| 2008/0252278 A1 | 10/2008 | Lindeberg et al. |
| 2008/0258831 A1 | 10/2008 | Kunihiro et al. |
| 2008/0280577 A1 | 11/2008 | Beukema et al. |
| 2009/0004981 A1 | 1/2009 | Eliezer et al. |
| 2009/0097591 A1 | 4/2009 | Kim |
| 2009/0160548 A1 | 6/2009 | Ishikawa et al. |
| 2009/0167260 A1 | 7/2009 | Pauritsch et al. |
| 2009/0174466 A1 | 7/2009 | Hsieh et al. |
| 2009/0184764 A1 | 7/2009 | Markowski et al. |
| 2009/0190699 A1 | 7/2009 | Kazakevich et al. |
| 2009/0218995 A1 | 9/2009 | Ahn |
| 2009/0230934 A1 | 9/2009 | Hooijschuur et al. |
| 2009/0261908 A1 | 10/2009 | Markowski |
| 2009/0284235 A1 | 11/2009 | Weng et al. |
| 2009/0289720 A1 | 11/2009 | Takinami et al. |
| 2009/0319065 A1 | 12/2009 | Risbo |
| 2010/0001793 A1 | 1/2010 | Van Zeijl et al. |
| 2010/0019749 A1 | 1/2010 | Katsuya et al. |
| 2010/0019840 A1 | 1/2010 | Takahashi |
| 2010/0026250 A1 | 2/2010 | Petty |
| 2010/0045247 A1 | 2/2010 | Blanken et al. |
| 2010/0171553 A1 | 7/2010 | Okubo et al. |
| 2010/0253309 A1 | 10/2010 | Xi et al. |
| 2010/0266066 A1 | 10/2010 | Takahashi |
| 2010/0301947 A1 | 12/2010 | Fujioka et al. |
| 2010/0308654 A1 | 12/2010 | Chen |
| 2010/0311365 A1 | 12/2010 | Vinayak et al. |
| 2010/0321127 A1 | 12/2010 | Watanabe et al. |
| 2010/0327825 A1 | 12/2010 | Mehas et al. |
| 2011/0018626 A1 | 1/2011 | Kojima |
| 2011/0058601 A1 | 3/2011 | Kim et al. |
| 2011/0084760 A1 | 4/2011 | Guo et al. |
| 2011/0148375 A1 | 6/2011 | Tsuji |
| 2011/0234182 A1 | 9/2011 | Wilson |
| 2011/0235827 A1 | 9/2011 | Lesso et al. |
| 2011/0279180 A1 | 11/2011 | Yamanouchi et al. |
| 2011/0298539 A1 | 12/2011 | Drogi et al. |
| 2012/0025907 A1 | 2/2012 | Koo et al. |
| 2012/0025919 A1 | 2/2012 | Huynh |
| 2012/0034893 A1 | 2/2012 | Baxter et al. |
| 2012/0049953 A1 | 3/2012 | Khlat |
| 2012/0068767 A1 | 3/2012 | Henshaw et al. |
| 2012/0074916 A1 | 3/2012 | Trochut |
| 2012/0133299 A1 | 5/2012 | Capodivacca et al. |
| 2012/0139516 A1 | 6/2012 | Tsai et al. |
| 2012/0154035 A1 | 6/2012 | Hongo et al. |
| 2012/0154054 A1 | 6/2012 | Kaczman et al. |
| 2012/0170334 A1 | 7/2012 | Menegoli et al. |
| 2012/0176196 A1 | 7/2012 | Khlat |
| 2012/0194274 A1 | 8/2012 | Fowers et al. |
| 2012/0200354 A1 | 8/2012 | Ripley et al. |
| 2012/0236444 A1 | 9/2012 | Srivastava et al. |
| 2012/0244916 A1 | 9/2012 | Brown et al. |
| 2012/0299647 A1 | 11/2012 | Honjo et al. |
| 2013/0034139 A1 | 2/2013 | Khlat et al. |
| 2013/0094553 A1 | 4/2013 | Paek et al. |
| 2013/0169245 A1 | 7/2013 | Kay et al. |
| 2013/0214858 A1 | 8/2013 | Tournatory et al. |
| 2013/0229235 A1 | 9/2013 | Ohnishi |
| 2013/0307617 A1 | 11/2013 | Khlat et al. |
| 2013/0328613 A1 | 12/2013 | Kay et al. |
| 2014/0009200 A1 | 1/2014 | Kay et al. |
| 2014/0009227 A1 | 1/2014 | Kay et al. |

FOREIGN PATENT DOCUMENTS

| | | |
|---|---|---|
| EP | 1569330 A1 | 8/2005 |
| EP | 2214304 A1 | 8/2010 |
| EP | 2244366 A1 | 10/2010 |
| EP | 2372904 A1 | 10/2011 |
| GB | 2462204 A | 2/2010 |
| GB | 2465552 A | 5/2010 |
| GB | 2484475 A | 4/2012 |
| WO | 0048306 A1 | 8/2000 |
| WO | 2004002006 A1 | 12/2003 |
| WO | 2004082135 A2 | 9/2004 |
| WO | 2005013084 A2 | 2/2005 |
| WO | 2006021774 A1 | 3/2006 |
| WO | 2006070319 A1 | 7/2006 |
| WO | 2006073208 A1 | 7/2006 |
| WO | 2007107919 A1 | 9/2007 |
| WO | 2007149346 A2 | 12/2007 |
| WO | 2012151594 A2 | 11/2012 |
| WO | 2012172544 A1 | 12/2012 |

OTHER PUBLICATIONS

Notice of Allowance for U.S. Appl. No. 14/022,858, mailed Oct. 25, 2013, 9 pages.

Non-Final Office Action for U.S. Appl. No. 13/550,049, mailed Nov. 25, 2013, 6 pages.

Non-Final Office Action for U.S. Appl. No. 12/836,307, mailed Nov. 5, 2013, 6 pages.

Examination Report for European Patent Application No. 11720630, mailed Aug. 16, 2013, 5 pages.

Notice of Allowance for U.S. Appl. No. 13/188,024, mailed Jun. 18, 2013, 7 pages.

International Preliminary Report on Patentability for PCT/US2011/054106 mailed Apr. 11, 2013, 8 pages.

International Preliminary Report on Patentability for PCT/US2011/061007 mailed May 30, 2013, 11 pages.

International Preliminary Report on Patentability for PCT/US2011/061009 mailed May 30, 2013, 10 pages.

Non-Final Office Action for U.S. Appl. No. 13/423,649, mailed May 22, 2013, 7 pages.

Advisory Action for U.S. Appl. No. 13/222,484, mailed Jun. 14, 2013, 3 pages.

International Preliminary Report on Patentability for PCT/US2011/064255, mailed Jun. 20, 2013, 7 pages.

Notice of Allowance for U.S. Appl. No. 13/343,840, mailed Jul. 1, 2013, 8 pages.

Notice of Allowance for U.S. Appl. No. 13/363,888, mailed Jul. 18, 2013, 9 pages.

Notice of Allowance for U.S. Appl. No. 13/222,453, mailed Aug. 22, 2013, 8 pages.

International Preliminary Report on Patentability for PCT/US2012/024124, mailed Aug. 22, 2013, 8 pages.

Notice of Allowance for U.S. Appl. No. 13/550,060, mailed Aug. 16, 2013, 8 pages.

Notice of Allowance for U.S. Appl. No. 13/222,484, mailed Aug. 26, 2013, 8 pages.

International Preliminary Report on Patentability for PCT/US2012/023495, mailed Aug. 15, 2013, 10 pages.

Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.

(56) References Cited

OTHER PUBLICATIONS

Cidronali, A. et al., "A 240W Dual-Band 870 and 2140 MHz Envelope Tracking GaN PA Designed by a Probability Distribution Conscious Approach," IEEE MTT-S International Microwave Symposium Digest, Jun. 5-10, 2011, 4 pages.
Dixon, N., "Standardisation Boosts Momentum for Envelope Tracking," Microwave Engineering, Europe, Apr. 20, 2011, 2 pages, http://www.mwee.com/en/standardisation-boosts-momentum-for-envelope-tracking.html?cmp_ids=71&news$_{13}$ ids=222901746.
Hekkala, A. et al., "Adaptive Time Misalignment Compensation in Envelope Tracking Amplifiers," 2008 IEEE International Symposium on Spread Spectrum Techniques and Applications, Aug. 2008, pp. 761-765.
Kim et al., "High Efficiency and Wideband Envelope Tracking Power Amplifiers with Sweet Spot Tracking," 2010 IEEE Radio Frequency Integrated Circuits Symposium, May 23-25, 2010, pp. 255-258.
Kim, N. et al, "Ripple Feedback Filter Suitable for Analog/Digital Mixed-Mode Audio Amplifier for Improved Efficiency and Stability," 2002 IEEE Power Electronics Specialists Conference, vol. 1, Jun. 23, 2002, pp. 45-49.
Knutson, P, et al., "An Optimal Approach to Digital Raster Mapper Design," 1991 IEEE International Conference on Consumer Electronics held Jun. 5-7, 1991, vol. 37, Issue 4, published Nov. 1991, pp. 746-752.
Le, Hanh-Phuc et al., "A 32nm Fully Integrated Reconfigurable Switched-Capacitor DC-DC Convertor Delivering 0.55W/mm^2 at 81% Efficiency," 2010 IEEE International Solid State Circuits Conference, Feb. 7-11, 2010, pp. 210-212.
Li, Y. et al., "A Highly Efficient SiGe Differential Power Amplifier Using an Envelope-Tracking Technique for 3GPP LTE Applications," 2010 IEEE Bipolar/BiCMOS Circuits and Technology Meeting (BCTM), Oct. 4-6, 2010, pp. 121-124.
Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.
Unknown, "Nujira Files 100th Envelope Tracking Patent," CS: Compound Semiconductor, Apr. 11, 2011, 1 page, http://www.compoundsemiconductor.net/csc/news-details.php?cat=news&id=19733338&key=Nujira%20Files%20100th%20Envelope%20Tracking%20Patent&type=n.
Non-final Office Action for U.S. Appl. No. 11/113,873, now Patent No. 7,773,691, mailed Feb. 1, 2008, 17 pages.
Final Office Action for U.S. Appl. No. 11/113,873, now Patent No. 7,773,691, mailed Jul. 30, 2008, 19 pages.
Non-final Office Action for U.S. Appl. No. 11/113,873, now Patent No. 7,773,691, mailed Nov. 26, 2008, 22 pages.
Final Office Action for U.S. Appl. No. 11/113,873, now Patent No. 7,773,691, mailed May 4, 2009, 20 pages.
Non-final Office Action for U.S. Appl. No. 11/113,873, now Patent No. 7,773,691, mailed Feb. 3, 2010, 21 pages.
Notice of Allowance for U.S. Appl. No. 11/113,873, now Patent No. 7,773,691, mailed Jun. 9, 2010, 7 pages.
International Search Report for PCT/US06/12619 mailed May 8, 2007, 2 pages.
Extended European Search Report for application 06740532.4 mailed Dec. 7, 2010, 7 pages.
Non-final Office Action for U.S. Appl. No. 12/112,006 mailed Apr. 5, 2010, 6 pages.
Notice of Allowance for U.S. Appl. No. 12/112,006 mailed Jul. 19, 2010, 6 pages.
Non-final Office Action for U.S. Appl. No. 13/089,917 mailed Nov. 23, 2012, 6 pages.
International Search Report for PCT/US11/033037, mailed Aug. 9, 2011, 10 pages.
International Preliminary Report on Patentability for PCT/US2011/033037 mailed Oct. 23, 2012, 7 pages.
Non-Final Office Action for U.S. Appl. No. 13/188,024, mailed Feb. 5, 2013, 8 pages.
International Search Report for PCT/US2011/044857, mailed Oct. 24, 2011, 10 pages.
International Preliminary Report on Patentability for PCT/US2011/044857 mailed Mar. 7, 2013, 6 pages.
Non-final Office Action for U.S. Appl. No. 13/218,400 mailed Nov. 8, 2012, 7 pages.
Notice of Allowance for U.S. Appl. No. 13/218,400 mailed Apr. 11, 2013, 7 pages.
International Search Report for PCT/US11/49243, mailed Dec. 22, 2011, 9 pages.
International Preliminary Report on Patentability for PCT/US11/49243 mailed Nov. 13, 2012, 33 pages.
International Search Report for PCT/US2011/054106 mailed Feb. 9, 2012, 11 pages.
International Search Report for PCT/US2011/061007 mailed Aug. 16, 2012, 16 pages.
Non-Final Office Action for U.S. Appl. No. 13/297,470 mailed May 8, 2013, 15 pages.
International Search Report for PCT/US2011/061009 mailed Feb. 8, 2012, 14 pages.
International Search Report for PCT/US2012/023495 mailed May 7, 2012, 13 pages.
Non-final Office Action for U.S. Appl. No. 13/222,453 mailed Dec. 6, 2012, 13 pages.
Notice of Allowance for U.S. Appl. No. 13/222,453 mailed Feb. 21, 2013, 7 pages.
Invitation to Pay Additional Fees and Where Applicable Protest Fee for PCT/US2012/024124 mailed Jun. 1, 2012, 7 pages.
International Search Report for PCT/US2012/024124 mailed Aug. 24, 2012, 14 pages.
Notice of Allowance for U.S. Appl. No. 13/316,229 mailed Nov. 14, 2012, 9 pages.
International Search Report for PCT/US2011/064255 mailed Apr. 3, 2012, 12 pages.
International Search Report for PCT/US2012/40317 mailed Sep. 7, 2012, 7 pages.
International Search Report for PCT/US2012/046887 mailed Dec. 21, 2012, 12 pages.
Non-final Office Action for U.S. Appl. No. 13/222,484 mailed Nov. 8, 2012, 9 pages.
Final Office Action for U.S. Appl. No. 13/222,484 mailed Apr. 10, 2013, 10 pages.
International Search Report and Written Opinion for PCT/US2012/053654 mailed Feb. 15, 2013, 11 pages.
International Search Report and Written Opinion for PCT/US2012/062070, mailed Jan. 21, 2013, 12 pages.
International Search Report and Written Opinion for PCT/US2012/067230 mailed Feb. 21, 2013, 10 pages.
Wu, Patrick Y. et al., "A Two-Phase Switching Hybrid Supply Modulator for RF Power Amplifiers with 9% Efficiency Improvement," IEEE Journal of Solid-State Circuits, vol. 45, No. 12, Dec. 2010, pp. 2543-2556.
Yousefzadeh, Vahid et al., "Band Separation and Efficiency Optimization in Linear-Assisted Switching Power Amplifiers," 37th IEEE Power Electronics Specialists Conference, Jun. 18-22, 2006, pp. 1-7.
International Preliminary Report on Patentability for PCT/US2012/040317, mailed Dec. 12, 2013, 5 pages.
Notice of Allowance for U.S. Appl. No. 13/531,719, mailed Dec. 30, 2013, 7 pages.
Non-Final Office Action for U.S. Appl. No. 14/022,940, mailed Dec. 20, 2013, 5 pages.
International Search Report and Written Opinion for PCT/US2013/052277, mailed Jan. 7, 2014, 14 pages.
Lie, Donald Y.C. et al., "Design of Highly-Efficient Wideband RF Polar Transmitters Using Envelope-Tracking (ET) for Mobile WiMAX/Wibro Applications," IEEE 8th International Conference on ASIC (ASCION), Oct. 20-23, 2009, pp. 347-350.
Lie, Donald Y.C. et al., "Highly Efficient and Linear Class E SiGe Power Amplifier Design," 8th International Conference on Solid-State and Integrated Circuit Technology (ICSICT), Oct. 23-26, 2006, pp. 1526-1529.
Non-Final Office Action for U.S. Appl. No. 13/367,973, mailed Sep. 24, 2013, 8 pages.

(56) References Cited

OTHER PUBLICATIONS

Notice of Allowance for U.S. Appl. No. 13/423,649, mailed Aug. 30, 2013, 8 pages.
Notice of Allowance for U.S. Appl. No. 13/316,229, mailed Aug. 29, 2013, 8 pages.
Quayle Action for U.S. Appl. No. 13/531,719, mailed Oct. 10, 2013, 5 pages.
Notice of Allowance for U.S. Appl. No. 13/602,856, mailed Sep. 24, 2013, 9 pages.
Hassan, Muhammad, et al., "A Combined Series-Parallel Hybrid Envelope Amplifier for Envelope Tracking Mobile Terminal RF Power Amplifier Applications," IEEE Journal of Solid-State Circuits, vol. 47, No. 5, May 1, 2012, pp. 1185-1198.
Hoversten, John, et al., "Codesign of PA, Supply, and Signal Processing for Linear Supply-Modulated RF Transmitters," IEEE Transactions on Microwave Theory and Techniques, vol. 60, No. 6, Jun. 2012, pp. 2010-2020.
Notice of Allowance for U.S. Appl. No. 12/836,307 mailed May 5, 2014, 6 pages.
Examination Report for European Patent Application No. 11720630.0 issued Mar. 18, 2014, 4 pages.
Notice of Allowance for U.S. Appl. No. 13/297,490, mailed Feb. 27, 2014, 7 pages.
Non-Final Office Action for U.S. Appl. No. 13/297,470, mailed Feb. 20, 2014, 16 pages.
Notice of Allowance for U.S. Appl. No. 14/022,858 mailed May 27, 2014, 6 pages.
Non-Final Office Action for U.S. Appl. No. 13/367,973 mailed Apr. 25, 2014, 5 pages.
Non-Final Office Action for U.S. Appl. No. 13/486,012, mailed Jul. 28, 2014, 7 pages.
Notice of Allowance for U.S. Appl. No. 13/550,049, mailed Mar. 6, 2014, 5 pages.
International Preliminary Report on Patentability for PCT/US2012/046887, mailed Jan. 30, 2014, 8 pages.
International Preliminary Report on Patentability for PCT/US2012/053654, mailed Mar. 13, 2014, 7 pages.
Non-Final Office Action for U.S. Appl. No. 13/647,815 mailed May 2, 2014, 6 pages.
Non-Final Office Action for U.S. Appl. No. 13/689,883 mailed Mar. 27, 2014, 13 pages.
International Preliminary Report on Patentability for PCT/US2012/062070 mailed May 8, 2014, 8 pages.
Non-Final Office Action for U.S. Appl. No. 13/661,552, mailed Feb. 21, 2014, 5 pages.
Notice of Allowance for U.S. Appl. No. 13/661,552, mailed Jun. 13, 2014, 5 pages.
International Search Report and Written Opinion for PCT/US2012/062110 issued Apr. 8, 2014, 12 pages.
International Preliminary Report on Patentability for PCT/US2012/062110 mailed May 8, 2014, 9 pages.
Non-Final Office Action for U.S. Appl. No. 13/692,084 mailed Apr. 10, 2014, 6 pages.
Notice of Allowance for U.S. Appl. No. 13/692,084, mailed Jul. 23, 2014, 7 pages.
International Preliminary Report on Patentability and Written Opinion for PCT/US2012/067230, mailed Jun. 12, 2014, 7 pages.
Notice of Allowance for U.S. Appl. No. 14/022,940, mailed Jun. 10, 2014, 7 pages.
Non-Final Office Action for U.S. Appl. No. 13/714,600, mailed May 9, 2014, 14 pages.
Non-Final Office Action for U.S. Appl. No. 13/951,976 mailed Apr. 4, 2014, 7 pages.
International Search Report and Written Opinion for PCT/US2013/065403, mailed Feb. 5, 2014, 11 pages.
International Search Report and Written Opinion for PCT/US2014/028089, mailed Jul. 17, 2014, 10 pages.
European Search Report for Patent Application No. 14162682.0, issued Aug. 27, 2014, 7 pages.
Invitation to Pay Additional Fees and Partial International Search Report for PCT/US2014/028178, mailed Jul. 24, 2014, 7 pages.
Notice of Allowance for U.S. Appl. No.. 14/072,140, mailed Aug. 27, 2014, 8 pages.
Non-Final Office Action for U.S. Appl. No. 14/072,225, mailed Aug. 15, 2014, 4 pages.
Notice of Allowance for U.S. Appl. No. 13/548,283, mailed Sep. 3, 2014, 7 pages.
Non-Final Office Action for U.S. Appl. No. 13/689,883, mailed Aug. 27, 2014, 12 pages.
Notice of Allowance for U.S. Appl. No. 13/690,187, mailed Sep. 3, 2014, 9 pages.
Non-Final Office Action for U.S. Appl. No. 13/782,142, mailed Sep. 4, 2014, 6 pages.
Non-Final Office Action for U.S. Appl. No. 12/836,307, mailed Sep. 25, 2014, 5 pages.
Advisory Action for U.S. Appl. No. 13/297,470, mailed Sep. 19, 2014, 3 pages.
Non-Final Office Action for U.S. Appl. No. 13/297,470, mailed Oct. 20, 2014, 22 pages.
Notice of Allowance for U.S. Appl. No. 13/367,973, mailed Sep. 15, 2014, 7 pages.
Notice of Allowance for U.S. Appl. No. 13/647,815, mailed Sep. 19, 2014, 6 pages.
Non-Final Office Action for U.S. Appl. No. 13/661,227, mailed Sep. 29, 2014, 24 pages.
Non-Final Office Action for U.S. Appl. No. 13/714,600, mailed Oct. 15, 2014, 13 pages.
Notice of Allowance for U.S. Appl. No. 13/914,888, mailed Oct. 17, 2014, 10 pages.
Non-Final Office Action for U.S. Appl. No. 13/747,725, mailed Oct. 7, 2014, 6 pages.
Notice of Allowance for U.S. Appl. No. 13/486,012, mailed Nov. 21, 2014, 8 pages.
Non-Final Office Action for U.S. Appl. No. 13/747,749, mailed Nov. 12, 2014, 32 pages.
Notice of Allowance for U.S. Appl. No. 14/072,140, mailed Dec. 2, 2014, 8 pages.
Extended European Search Report for European Patent Application No. 12794149.0, issued Oct. 29, 2014, 6 pages.
International Search Report and Written Opinion for PCT/US2014/012927, mailed Sep. 30, 2014, 11 pages.
International Search Report and Written Opinion for PCT/US2014/028178, mailed Sep. 30, 2014, 17 pages.

* cited by examiner

MONOTONIC CONVERSION OF RF POWER AMPLIFIER CALIBRATION DATA

RELATED APPLICATIONS

This application claims the benefit of U.S. provisional patent application No. 61/565,138, filed Nov. 30, 2011, the disclosure of which is hereby incorporated herein by reference in its entirety.

FIELD OF THE DISCLOSURE

Embodiments of the present disclosure relate to calibration systems and methods for calibrating radio frequency (RF) power amplifiers (PAs), which may be used in RF communication systems.

BACKGROUND

As RF communications protocols evolve, data rates tend to increase, which tends to cause bandwidths of transmitted RF signals to increase to support the higher data rates. However, in comparison to the increased bandwidths of the transmitted RF signals, duplex frequency spacings between transmitted and received RF signals may be relatively small, thereby putting tight noise constraints on RF communications systems. Further, RF transmitters need to be as efficient as possible to maximize battery life. Therefore, transmitter power amplifiers may be powered from switching converter-based envelope power supplies to maximize efficiency. As such, noise generated by the envelope power supplies may need to be minimized to meet the noise requirements of the RF communications system.

SUMMARY

Embodiments of the present disclosure relate to circuitry, which includes data memory and processing circuitry. The data memory is used to store look-up table (LUT)-based radio frequency (RF) power amplifier (PA) calibration data. The processing circuitry converts at least a portion of the LUT-based RF PA calibration data to provide monotonic response curve-based data. As such, a magnitude of an envelope power supply control signal is determined based on a magnitude of an RF input signal using the monotonic response curve-based data.

Due to inherent system noise during the calibration process, the LUT-based RF PA calibration data may be inherently noisy. As a result, when using the LUT-based RF PA calibration data to provide an envelope power supply signal to an RF PA of an RF system, noise may be introduced into the RF system, which may cause performance problems in the RF system, such as degrading receiver sensitivity. By converting at least a portion of the LUT-based RF PA calibration data to provide the monotonic response curve-based data, the noise in the RF system may be reduced.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Embodiments of the present disclosure relate to circuitry, which includes data memory and processing circuitry. The data memory is used to store look-up table (LUT)-based radio frequency (RF) power amplifier (PA) calibration data. The processing circuitry converts at least a portion of the LUT-based RF PA calibration data to provide monotonic response curve-based data. As such, a magnitude of an envelope power supply control signal is determined based on a magnitude of an RF input signal using the monotonic response curve-based data.

Due to inherent system noise during the calibration process, the LUT-based RF PA calibration data may be inherently noisy. As a result, when using the LUT-based RF PA calibration data to provide an envelope power supply signal to an RF PA of an RF system, noise may be introduced into the RF system, which may cause performance problems in the RF system, such as degrading receiver sensitivity. By converting at least a portion of the LUT-based RF PA calibration data to provide the monotonic response curve-based data, the noise in the RF system may be reduced.

Figure 1:
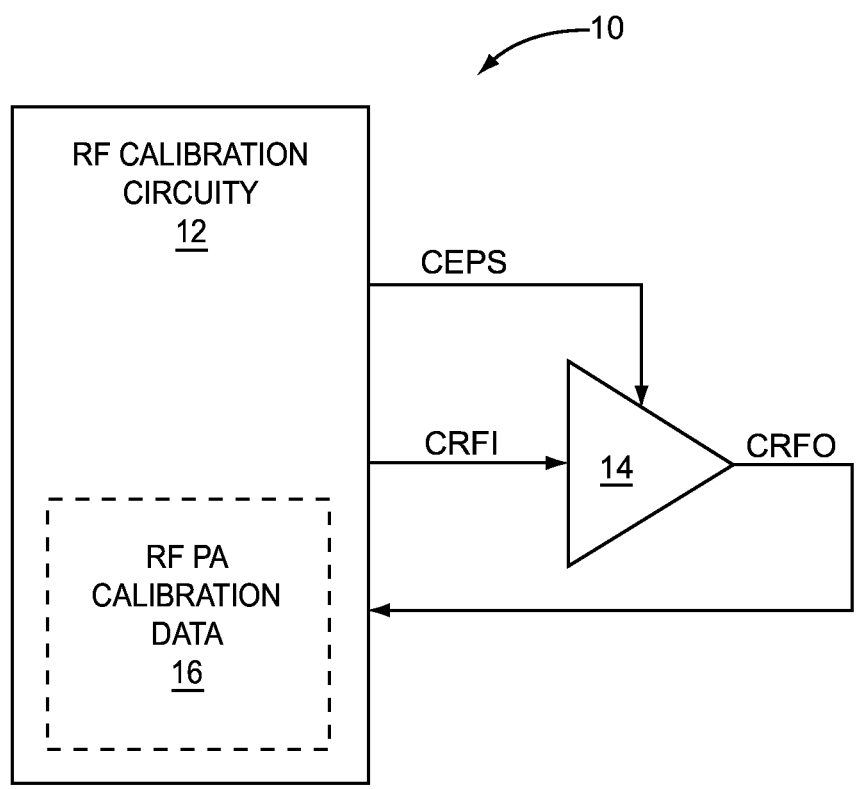
FIG. 1 shows circuitry used in a radio frequency (RF) power amplifier (PA) calibration environment according to one embodiment of the circuitry.

FIG. 1 shows circuitry 10 used in an RF PA calibration environment according to one embodiment of the circuitry 10. The circuitry 10 includes RF calibration circuitry 12 and a calibration RF PA 14. During a calibration of the calibration RF PA 14, the RF calibration circuitry 12 provides a calibration RF input signal CRFI and a calibration envelope power supply signal CEPS to the calibration RF PA 14. The calibration RF PA 14 receives and amplifies the calibration RF input signal CRFI to provide a calibration RF output signal CRFO using the calibration envelope power supply signal CEPS to provide power for amplification. The RF calibration circuitry 12 receives the calibration RF output signal CRFO.

During the calibration of the calibration RF PA 14, the RF calibration circuitry 12 varies a magnitude of the calibration RF input signal CRFI and varies a magnitude of the calibration envelope power supply signal CEPS and measures a resulting magnitude of the calibration RF output signal CRFO. The magnitude of the calibration RF input signal CRFI is associated with an input power level and the magnitude of the calibration RF output signal CRFO is associated with an output power level. In this regard, the RF calibration circuitry 12 creates RF PA calibration data 16 based on the magnitudes of the calibration RF input signal CRFI, the calibration envelope power supply signal CEPS, and the calibration RF output signal CRFO.

In one embodiment of the calibration of the calibration RF PA 14, the RF PA calibration data 16 is based on calibrating the calibration RF PA 14 for approximately constant gain operation over a calibration RF power range. This constant gain operation is called isogain. Further, during isogain conditions, the calibration RF PA 14 may be driven into compression, such that the magnitude of the calibration envelope power supply signal CEPS is insufficient to keep the calibration RF PA 14 operating in a completely linear manner. As such, during compression, an incremental response of the calibration RF output signal CRFO to an incremental change of the calibration RF input signal CRFI is less than an incremental response of the calibration RF output signal CRFO during linear operation. Operating the calibration RF PA 14 with compression may increase the efficiency of the calibration RF PA 14, but may degrade the linearity of the calibration RF PA 14. Therefore, by operating the calibration RF PA 14 with both isogain and compression, an optimum balance between efficiency and linearity may be achieved.

Figure 2:
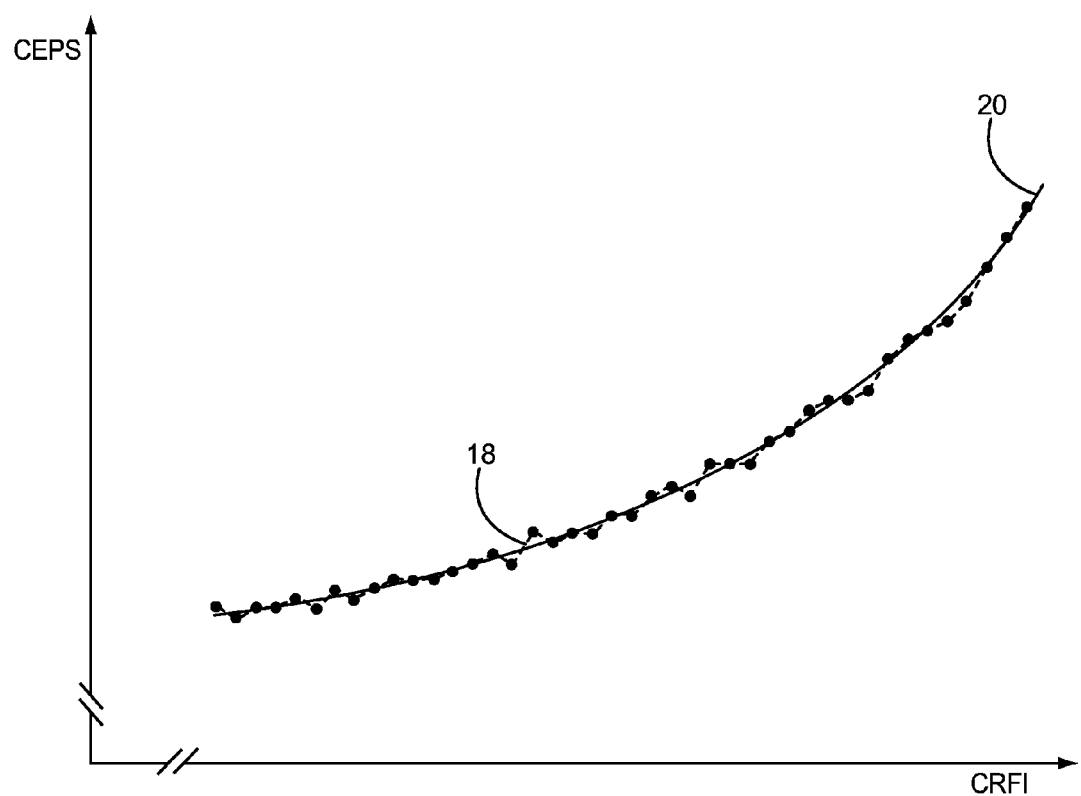
FIG. 2 shows a calibration data response curve and a monotonic response curve associated with the RF PA calibration environment illustrated in FIG. 1.

FIG. 2 shows a calibration data response curve 18 and a monotonic response curve 20 associated with the RF PA calibration environment illustrated in FIG. 1 according to one embodiment of calibrating the calibration RF PA 14 illustrated in FIG. 1. The calibration data response curve 18 is based on plotting the RF PA calibration data 16 (FIG. 1). Specifically, the calibration data response curve 18 relates the calibration envelope power supply signal CEPS (FIG. 1) to the calibration RF input signal CRFI (FIG. 1). However, due to inherent system noise during the calibration process, the calibration data response curve 18 may be noisy, as shown. This noise may degrade the ability of the RF calibration circuitry 12 (FIG. 1) to accurately calibrate the calibration RF PA 14 (FIG. 1). However, a monotonic conversion may be applied to the RF PA calibration data 16 (FIG. 1) to filter out at least some of the noise to provide the monotonic response curve 20.

A monotonic response curve is a response curve that does not have slope reversals. In general, a monotonic response curve has either a first characteristic or a second characteristic. A monotonic response curve having the first characteristic has a slope at any point on the curve that is either zero or positive, but never negative. A monotonic response curve having the second characteristic has a slope at any point on the curve that is either zero or negative, but never positive. The monotonic response curve 20 illustrated in FIG. 2 has the first characteristic, such that the monotonic response curve 20 is representative of the calibration envelope power supply signal CEPS relative to the calibration RF input signal CRFI, and as an envelope of the calibration RF input signal CRFI increases, a magnitude of the calibration envelope power supply signal CEPS never decreases. By using the monotonic response curve 20 instead of the calibration data response curve 18, accurate operation of the calibration RF PA 14 (FIG. 1) may be enhanced.

Figure 3:
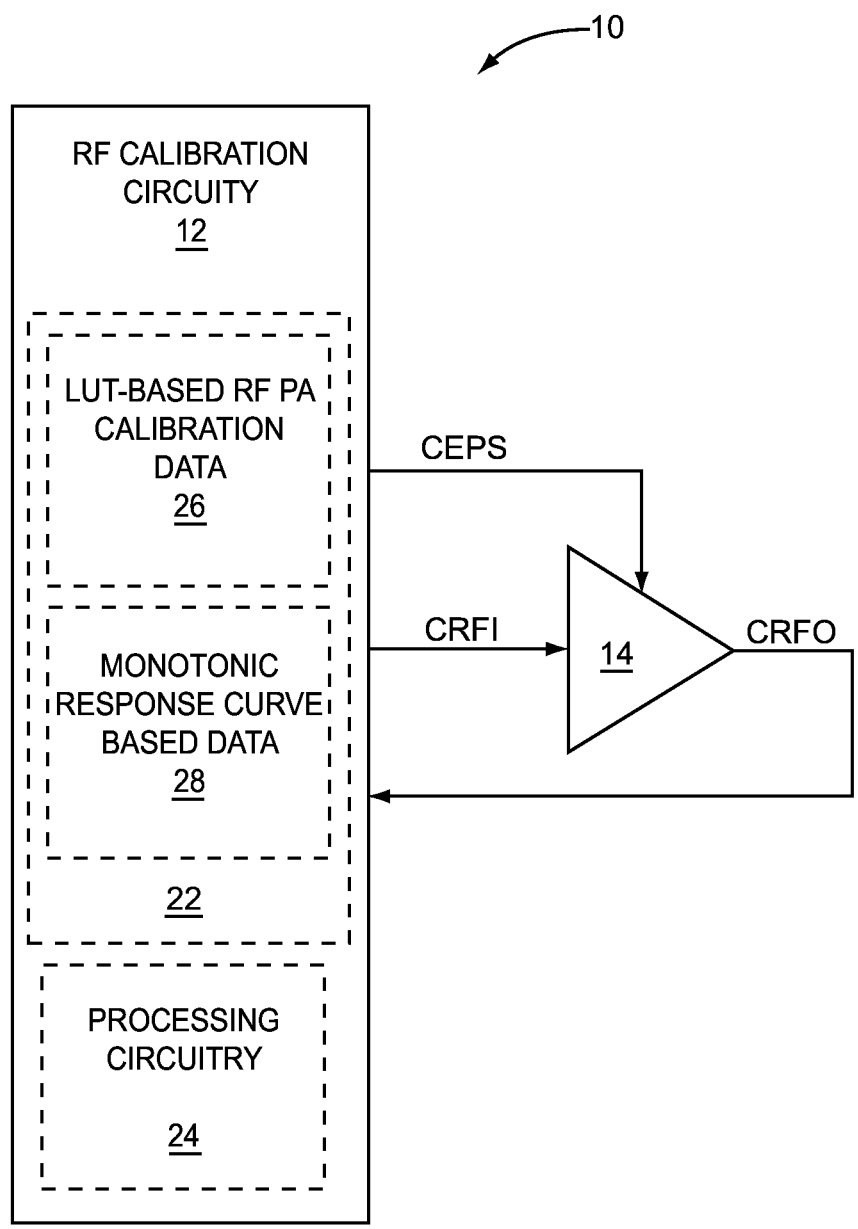
FIG. 3 shows details of RF calibration circuitry illustrated in FIG. 1 according to one embodiment of the RF calibration circuitry.

FIG. 3 shows details of the RF calibration circuitry 12 illustrated in FIG. 1 according to one embodiment of the RF calibration circuitry 12. The RF calibration circuitry 12 illustrated in FIG. 3 is similar to the RF calibration circuitry 12 illustrated in FIG. 1, except the RF calibration circuitry 12 illustrated in FIG. 3 further includes data memory 22 and processing circuitry 24. The data memory 22 includes LUT-based RF PA calibration data 26 and monotonic response curve-based data 28. The LUT-based RF PA calibration data 26 is based on the RF PA calibration data 16 (FIG. 1) by putting the RF PA calibration data 16 (FIG. 1) into a LUT-based format.

The monotonic response curve-based data 28 is based on the monotonic response curve 20 (FIG. 2). In one embodiment of the monotonic response curve-based data 28, the monotonic response curve-based data 28 is LUT-based data. The processing circuitry 24 converts at least a portion of the LUT-based RF PA calibration data 26 to provide the monotonic response curve-based data 28. In one embodiment of the monotonic response curve-based data 28, the monotonic response curve-based data 28 is a pre-distortion of the LUT-based RF PA calibration data 26 to reduce noise on the calibration envelope power supply signal CEPS.

The RF calibration circuitry 12 may enhance accurate operation of the calibration RF PA 14 by providing the calibration envelope power supply signal CEPS using the monotonic response curve-based data 28, such that a magnitude of the calibration envelope power supply signal CEPS is based on a magnitude of the calibration RF input signal CRFI. In one embodiment of the calibration of the calibration RF PA 14, the LUT-based RF PA calibration data 26 is based on calibrating the calibration RF PA 14 for approximately constant gain operation over a calibration RF power range.

In one embodiment of the monotonic response curve-based data 28, the monotonic response curve-based data 28 is based on a high order polynomial interpolation of at least a portion of the of the LUT-based RF PA calibration data 26. In a first embodiment of the high order polynomial interpolation, a number of data points used in the interpolation is at least two times an order of the high order polynomial interpolation. In a second embodiment of the high order polynomial interpolation, the number of data points used in the interpolation is at least five times the order of the high order polynomial interpolation. In a third embodiment of the high order polynomial interpolation, the number of data points used in the interpolation is at least ten times the order of the high order polynomial interpolation. In a fourth embodiment of the high order polynomial interpolation, the number of data points used in the interpolation is at least fifty times the order of the high order polynomial interpolation. In a fifth embodiment of the high order polynomial interpolation, the number of data points used in the interpolation is at least 100 times the order of the high order polynomial interpolation. In a sixth embodiment of the high order polynomial interpolation, the number of data points used in the interpolation is at least 500 times the order of the high order polynomial interpolation. In a seventh embodiment of the high order polynomial interpolation, the number of data points used in the interpolation is less than 1000 times the order of the high order polynomial interpolation.

Figure 4:
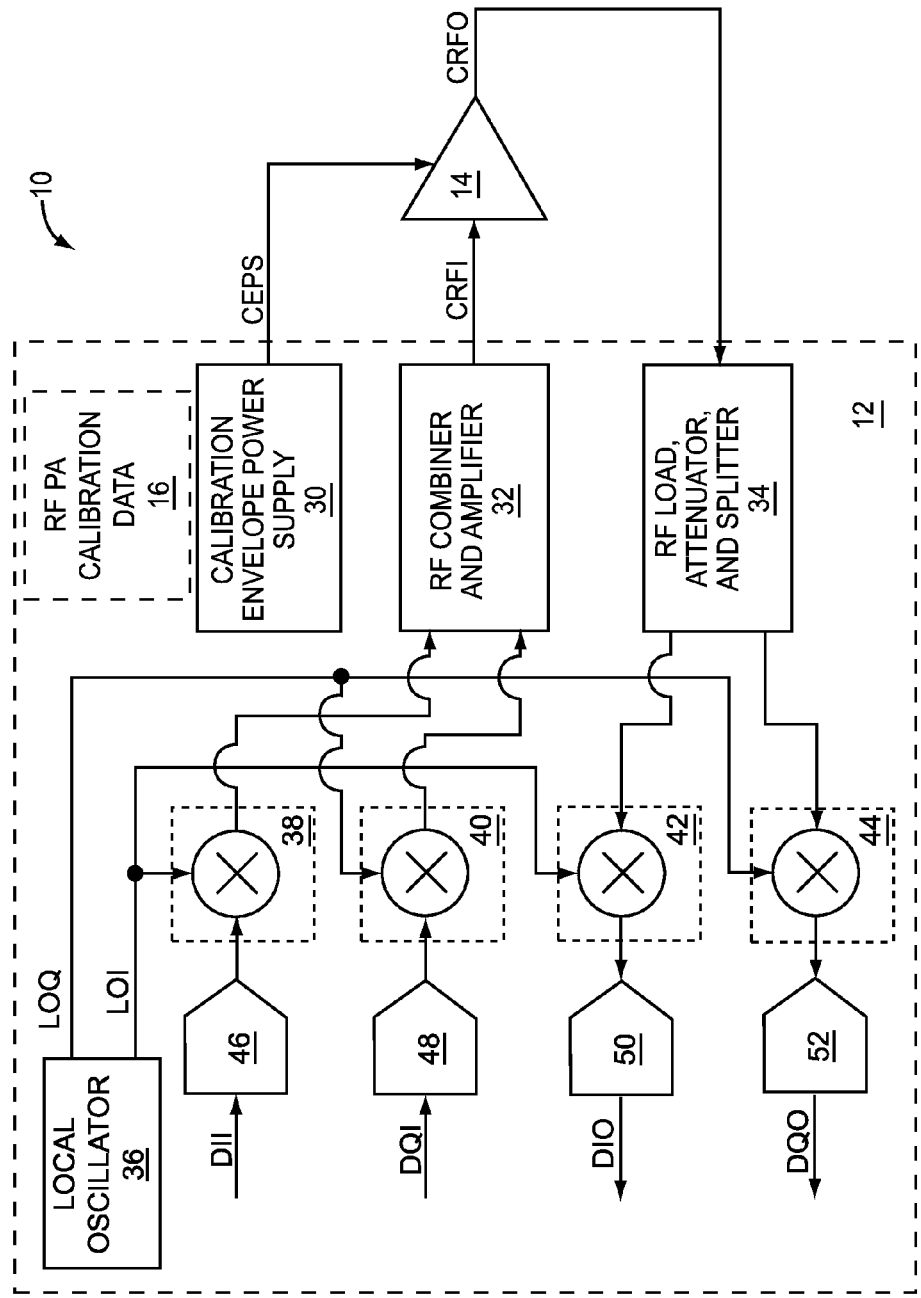
FIG. 4 shows details of the RF calibration circuitry illustrated in FIG. 1 according to an alternate embodiment of the RF calibration circuitry.

FIG. 4 shows details of the RF calibration circuitry 12 illustrated in FIG. 1 according to an alternate embodiment of the RF calibration circuitry 12. The RF calibration circuitry 12 includes a calibration envelope power supply 30, an RF combiner and amplifier 32, an RF load, attenuator, and splitter 34, a local oscillator 36, a first in-phase mixer 38, a first quadrature-phase mixer 40, a second in-phase mixer 42, a second quadrature-phase mixer 44, an in-phase digital-to-analog converter (DAC) 46, a quadrature-phase DAC 48, an in-phase analog-to-digital converter (ADC) 50, and a quadrature-phase ADC 52.

During calibration of the calibration RF PA 14, the calibration envelope power supply 30 provides the calibration envelope power supply signal CEPS to the calibration RF PA 14, the RF combiner and amplifier 32 provides the calibration RF input signal CRFI to the calibration RF PA 14, and the RF load, attenuator, and splitter 34 receives the calibration RF output signal CRFO from the calibration RF PA 14. The local oscillator 36 provides an in-phase local oscillator signal LOI to the first in-phase mixer 38 and to the second in-phase mixer 42. The local oscillator 36 provides a quadrature-phase local oscillator signal LOQ to the first quadrature-phase mixer 40 and to the second quadrature-phase mixer 44. During calibration, the quadrature-phase local oscillator signal LOQ is phase-shifted from the in-phase local oscillator signal LOI by about 90 degrees.

The in-phase DAC 46 receives and digital-to-analog converts an in-phase digital input signal DII to feed the first in-phase mixer 38. The quadrature-phase DAC 48 receives and digital-to-analog converts a quadrature-phase digital input signal DQI to feed the first quadrature-phase mixer 40. During calibration, the first in-phase mixer 38 and the first quadrature-phase mixer 40 up-convert the in-phase and the quadrature-phase DAC output signals using the local oscillator signals LOI, LOQ to feed the RF combiner and amplifier 32. The RF combiner and amplifier 32 combines and amplifies the up-converted signals to provide the calibration RF input signal CRFI.

During calibration, the RF load, attenuator, and splitter 34 presents an RF load to the calibration RF PA 14. Further, the RF load, attenuator, and splitter 34 receives and splits the calibration RF output signal CRFO to feed the second in-phase mixer 42 and the second quadrature-phase mixer 44. The second in-phase mixer 42 and the second quadrature-phase mixer 44 down-convert the split RF signals using the local oscillator signals LOI, LOQ to feed the in-phase ADC 50 and the quadrature-phase ADC 52. The in-phase ADC 50 analog-to-digital converts the signal from the second in-phase mixer 42 to provide an in-phase digital output signal DIO. The quadrature-phase ADC 52 analog-to-digital converts the signal from the second quadrature-phase mixer 44 to provide a quadrature-phase digital output signal DQO.

During calibration, the RF calibration circuitry 12 may vary the calibration envelope power supply signal CEPS, the in-phase local oscillator signal LOI, the quadrature-phase local oscillator signal LOQ, the in-phase digital input signal DII, the quadrature-phase digital input signal DQI, or any combination thereof, and measure the calibration results via the in-phase digital output signal DIO and the quadrature-phase digital output signal DQO to provide the RF PA calibration data 16.

However, noise may be introduced during calibration from a number of noise sources. Examples of noise sources during calibration may include leakage of the local oscillator signals LOI, LOQ into any unintended paths, leakage of signals from the local oscillator 36 into any unintended paths, imbalance between the in-phase local oscillator signal LOI and the quadrature-phase local oscillator signal LOQ, conversion mismatch between the in-phase DAC 46 and the quadrature-phase DAC 48, conversion mismatch between the in-phase ADC 50 and the quadrature-phase ADC 52, conversion mismatch between the first in-phase mixer 38 and the first quadrature-phase mixer 40, conversion mismatch between the second in-phase mixer 42 and the second quadrature-phase mixer 44, noise introduced into the up-conversion path, noise introduced into the down-conversion path, or any combination thereof.

Figure 5:
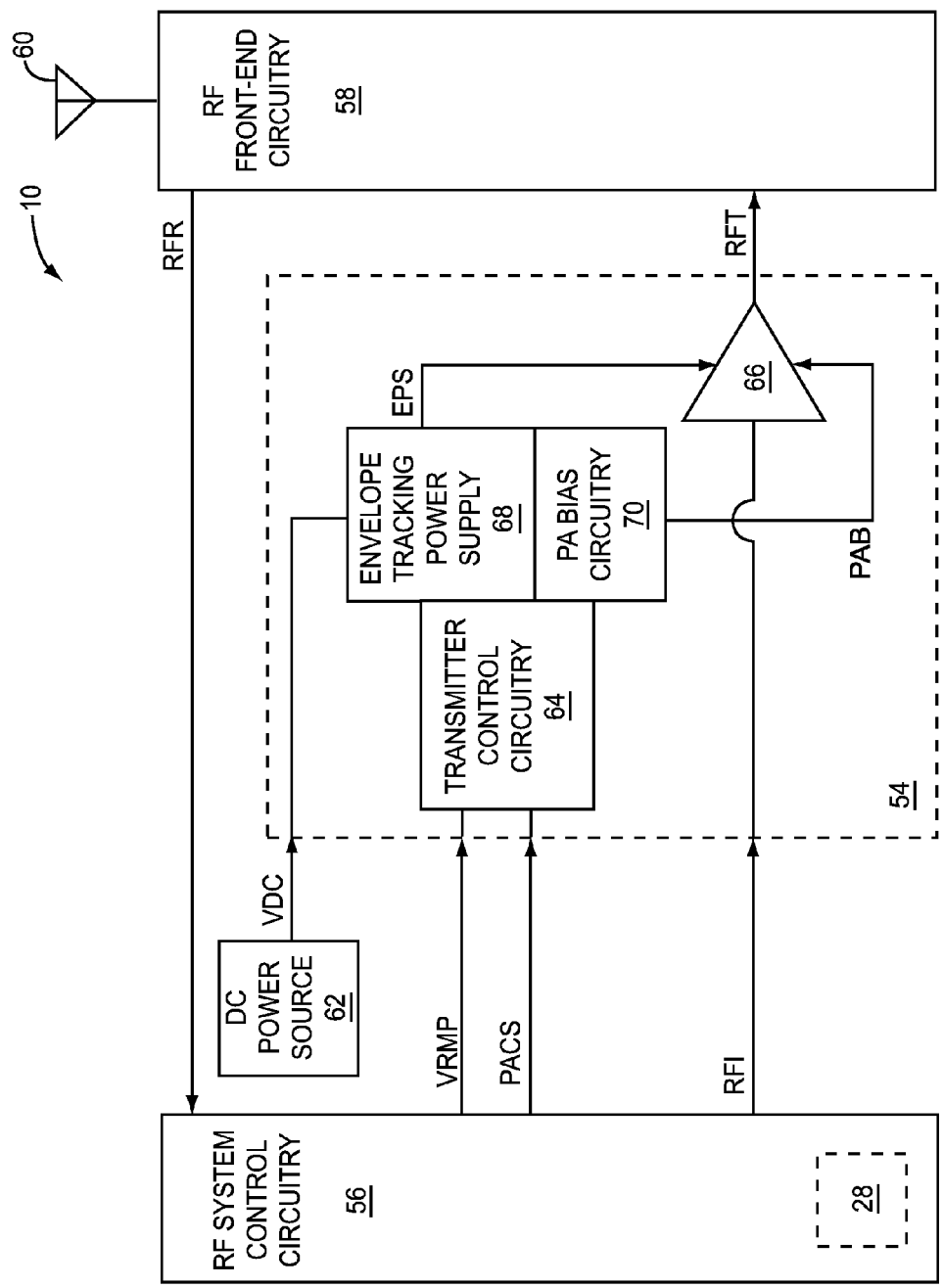
FIG. 5 shows circuitry used in an RF communications system according to one embodiment of the circuitry.

FIG. 5 shows circuitry 10 used in an RF communications system according to one embodiment of the circuitry 10. The circuitry 10 includes RF transmitter circuitry 54, RF system control circuitry 56, RF front-end circuitry 58, an RF antenna 60, and a DC power source 62. The RF transmitter circuitry 54 includes transmitter control circuitry 64, an RF PA 66, an envelope tracking power supply 68, and PA bias circuitry 70. The RF system control circuitry 56 includes the monotonic response curve-based data 28.

In one embodiment of the circuitry 10, the RF front-end circuitry 58 receives via the RF antenna 60, processes, and forwards an RF receive signal RFR to the RF system control circuitry 56. The RF system control circuitry 56 provides an envelope power supply control signal VRMP and a transmitter configuration signal PACS to the transmitter control circuitry 64. The RF system control circuitry 56 provides an RF input signal RFI to the RF PA 66. The DC power source 62 provides a DC source signal VDC to the envelope tracking power supply 68. In one embodiment of the DC power source 62, the DC power source 62 is a battery.

The transmitter control circuitry 64 is coupled to the envelope tracking power supply 68 and to the PA bias circuitry 70. The envelope tracking power supply 68 provides an envelope power supply signal EPS to the RF PA 66 based on the envelope power supply control signal VRMP. The DC source signal VDC provides power to the envelope tracking power supply 68. As such, the envelope power supply signal EPS is based on the DC source signal VDC. The envelope power supply control signal VRMP is representative of a setpoint of the envelope power supply signal EPS. In general, the envelope power supply signal EPS is based on the envelope power supply control signal VRMP. The RF PA 66 receives and amplifies the RF input signal RFI to provide an RF transmit signal RFT using the envelope power supply signal EPS. The envelope power supply signal EPS provides power for amplification.

The RF system control circuitry 56 may enhance accurate operation of the RF PA 66 by providing the envelope power supply control signal VRMP using the monotonic response curve-based data 28, such that a magnitude of the envelope power supply control signal VRMP is based on a magnitude of the RF input signal RFI. In one embodiment of the monotonic response curve-based data 28, the monotonic response curve-based data 28 is a pre-distortion of the LUT-based RF PA calibration data 26 (FIG. 3) to reduce noise on the envelope power supply signal EPS, such that the envelope power supply signal EPS is based on the envelope power supply control signal VRMP. In one embodiment of the RF PA 66, the RF PA 66 is the calibration RF PA 14 (FIG. 1). In an alternate embodiment of the RF PA 66, the RF PA 66 is not the calibration RF PA 14 (FIG. 1).

The RF front-end circuitry 58 receives, processes, and transmits the RF transmit signal RFT via the RF antenna 60. In one embodiment of the RF transmitter circuitry 54, the transmitter control circuitry 64 configures the RF transmitter circuitry 54 based on the transmitter configuration signal PACS. The PA bias circuitry 70 provides a PA bias signal PAB to the RF PA 66. In this regard, the PA bias circuitry 70 biases the RF PA 66 via the PA bias signal PAB. In one embodiment of the PA bias circuitry 70, the PA bias circuitry 70 biases the RF PA 66 based on the transmitter configuration signal PACS. In one embodiment of the RF front-end circuitry 58, the RF front-end circuitry 58 includes at least one RF switch, at least one RF amplifier, at least one RF filter, at least one RF duplexer, at least one RF diplexer, at least one RF amplifier, the like, or any combination thereof. In one embodiment of the RF system control circuitry 56, the RF system control circuitry 56 is RF transceiver circuitry, which may include an RF transceiver IC, baseband controller circuitry, the like, or any combination thereof. In one embodiment of the RF transmitter circuitry 54, the envelope power supply signal EPS provides power for amplification and envelope tracks the RF transmit signal RFT.

Figure 6:
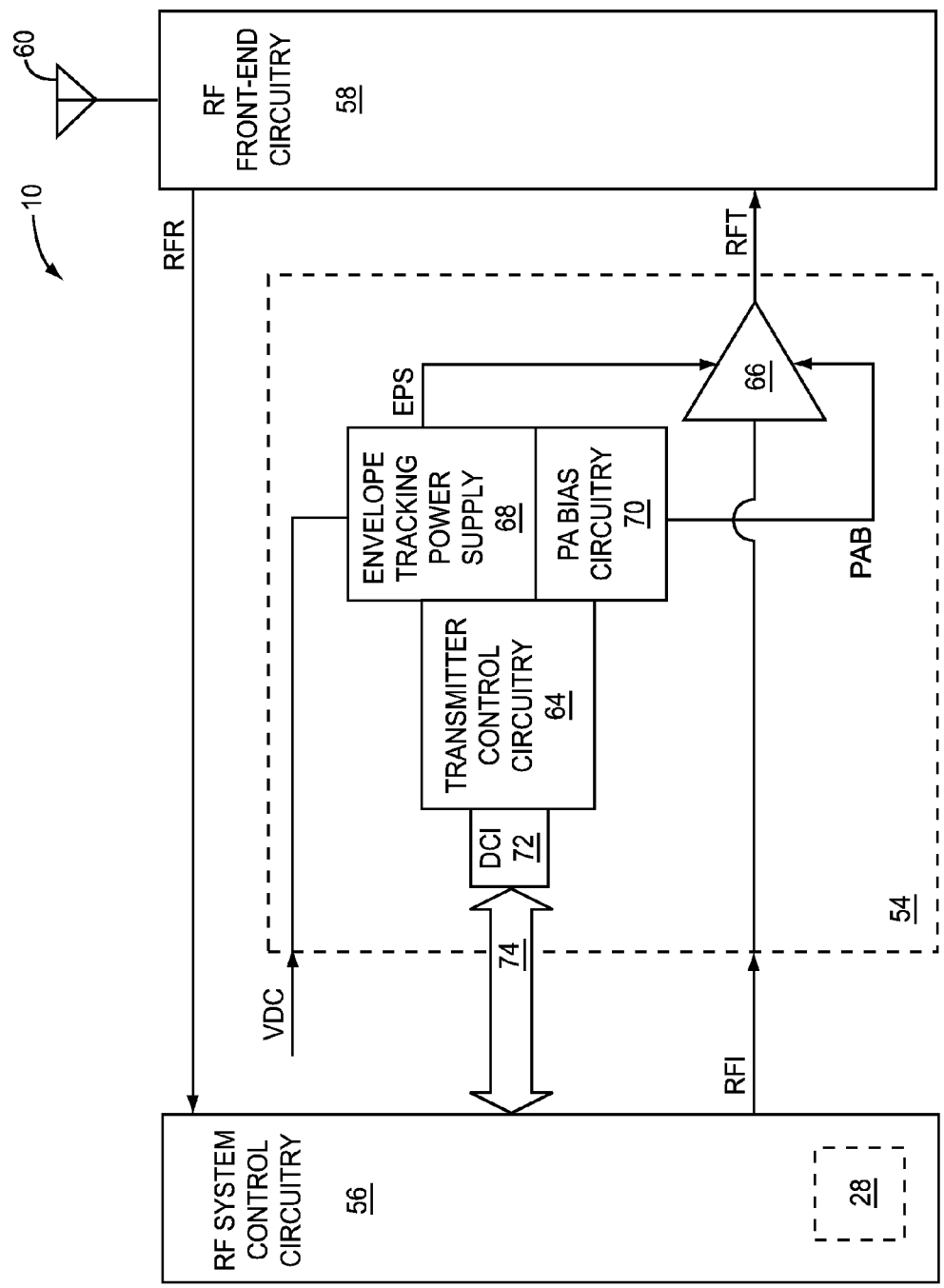
FIG. 6 shows circuitry used in an RF communications system according to an alternate embodiment of the circuitry.

FIG. 6 shows the circuitry 10 used in the RF communications system according to an alternate embodiment of the circuitry 10. The circuitry 10 illustrated in FIG. 6 is similar to the circuitry 10 illustrated in FIG. 5, except in the circuitry 10 illustrated in FIG. 6, the RF transmitter circuitry 54 further includes a digital communications interface 72, which is coupled between the transmitter control circuitry 64 and a digital communications bus 74. The digital communications bus 74 is also coupled to the RF system control circuitry 56. As such, the RF system control circuitry 56 provides the envelope power supply control signal VRMP (FIG. 5) and the transmitter configuration signal PACS (FIG. 5) to the transmitter control circuitry 64 via the digital communications bus 74 and the digital communications interface 72.

Figure 7:
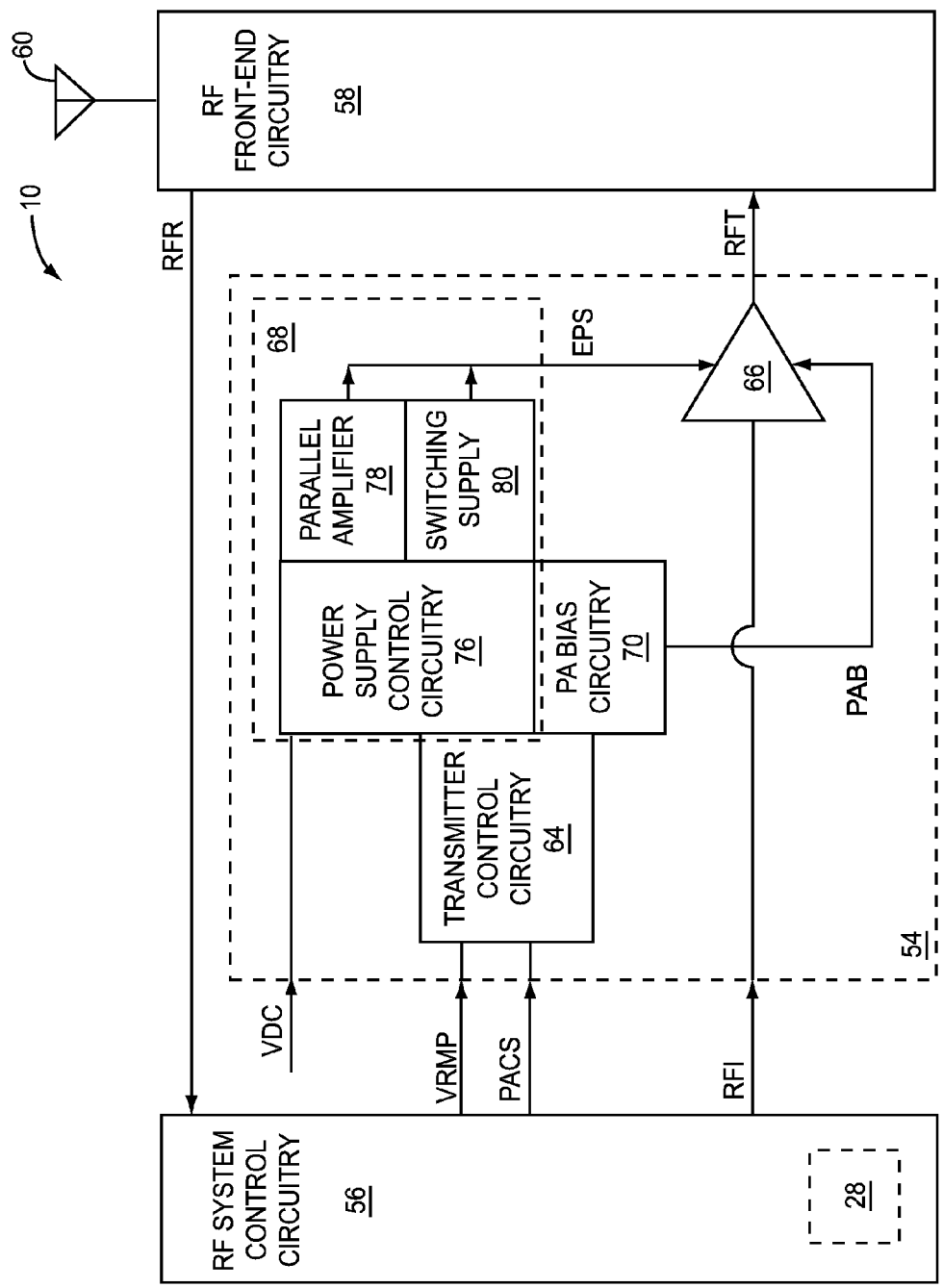
FIG. 7 shows circuitry used in an RF communications system according to an additional embodiment of the circuitry.

FIG. 7 shows the circuitry 10 used in the RF communications system according to an additional embodiment of the circuitry 10. FIG. 7 shows details of the envelope tracking power supply 68 illustrated in FIG. 5 according to one embodiment of the envelope tracking power supply 68. The envelope tracking power supply 68 includes power supply control circuitry 76, a parallel amplifier 78, and a switching supply 80. The power supply control circuitry 76 controls the parallel amplifier 78 and the switching supply 80. The parallel amplifier 78 and the switching supply 80 provide the envelope power supply signal EPS, such that the parallel amplifier 78 partially provides the envelope power supply signal EPS and the switching supply 80 partially provides the envelope power supply signal EPS. The switching supply 80 may provide power more efficiently than the parallel amplifier 78. However, the parallel amplifier 78 may provide the envelope power supply signal EPS more accurately than the switching supply 80. As such, the parallel amplifier 78 regulates a voltage of the envelope power supply signal EPS based on the setpoint of the envelope power supply signal EPS, and the switching supply 80 operates to drive an output current from the parallel amplifier 78 toward zero to maximize efficiency. In this regard, the parallel amplifier 78 behaves like a voltage source and the switching supply 80 behaves like a current source.

Figure 8:
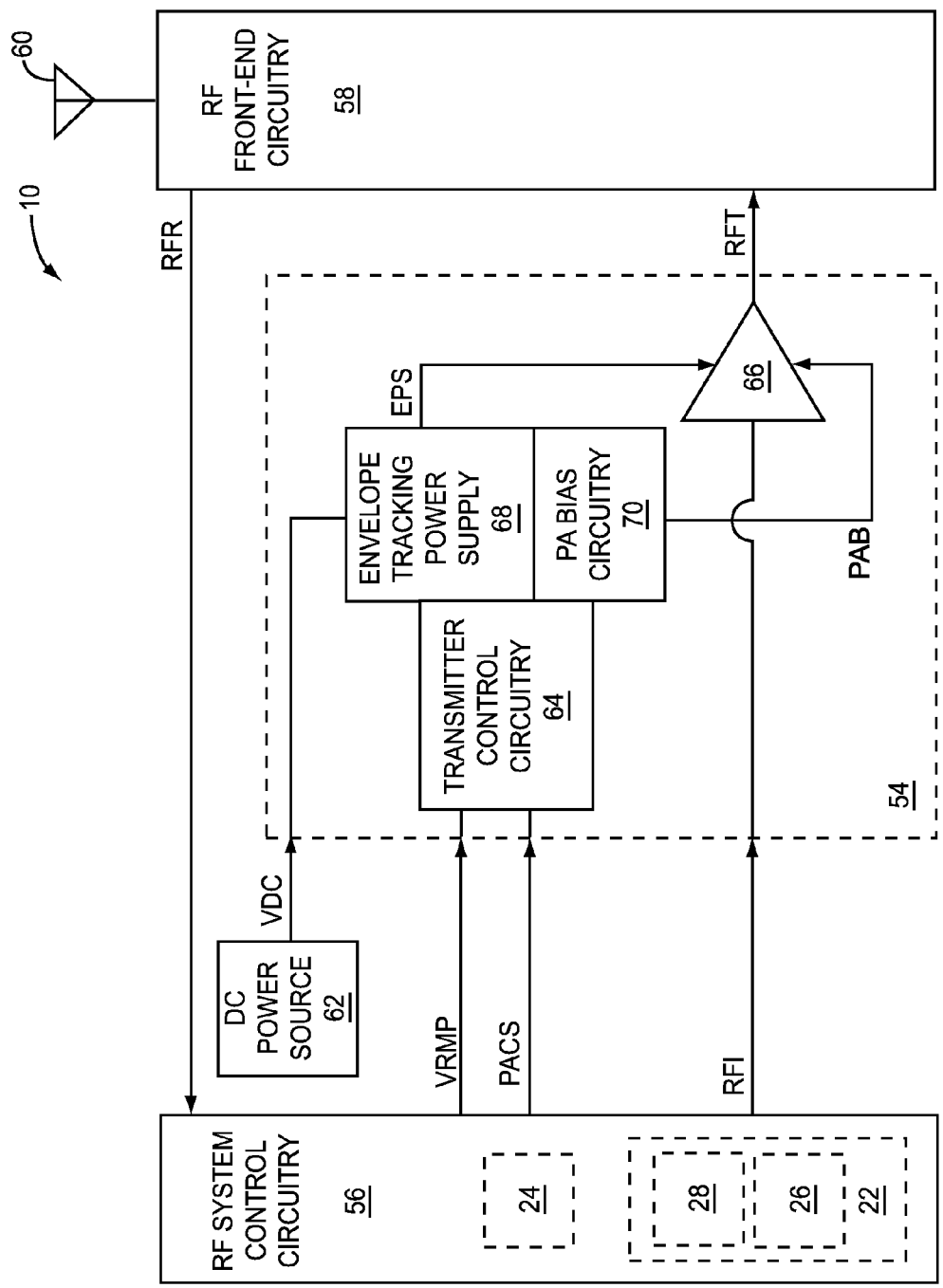
FIG. 8 shows circuitry used in an RF communications system according to another embodiment of the circuitry.

FIG. 8 shows the circuitry 10 used in the RF communications system according to another embodiment of the circuitry 10. The circuitry 10 illustrated in FIG. 8 is similar to the circuitry 10 illustrated in FIG. 5, except in the circuitry 10 illustrated in FIG. 8, the RF system control circuitry 56 includes the data memory 22 and the processing circuitry 24. The data memory 22 includes the LUT-based RF PA calibration data 26 and the monotonic response curve-based data 28.

The monotonic response curve-based data 28 is based on the monotonic response curve 20 (FIG. 2). In one embodiment of the monotonic response curve-based data 28, the monotonic response curve-based data 28 is LUT-based data. The processing circuitry 24 converts at least a portion of the LUT-based RF PA calibration data 26 to provide the monotonic response curve-based data 28. In one embodiment of the monotonic response curve-based data 28, the monotonic response curve-based data 28 is a pre-distortion of the LUT-based RF PA calibration data 26 to reduce noise on the envelope power supply signal EPS.

The RF system control circuitry 56 may enhance accurate operation of the RF PA 66 by providing the envelope power supply control signal VRMP using the monotonic response curve-based data 28, such that a magnitude of the envelope power supply control signal VRMP is based on a magnitude of the RF input signal RFI. In one embodiment of the circuitry 10, the LUT-based RF PA calibration data 26 is based on operating the RF PA 66 for approximately constant gain operation over an RF power range.

Figure 9:
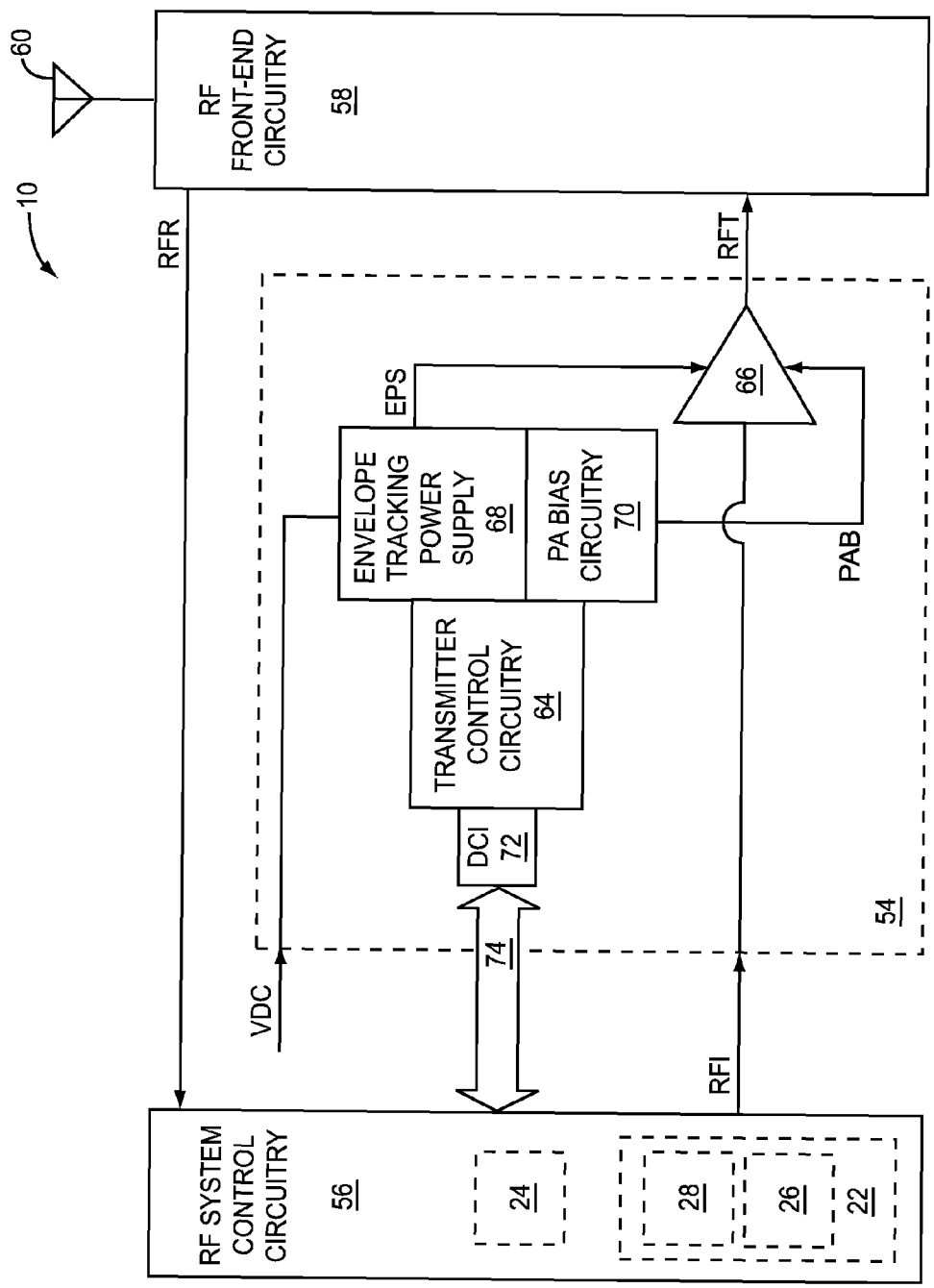
FIG. 9 shows circuitry used in an RF communications system according to a further embodiment of the circuitry.

FIG. 9 shows the circuitry 10 used in the RF communications system according to a further embodiment of the circuitry 10. The circuitry 10 illustrated in FIG. 9 is similar to the circuitry 10 illustrated in FIG. 8, except in the circuitry 10 illustrated in FIG. 9, the RF transmitter circuitry 54 further includes the digital communications interface 72, which is coupled between the transmitter control circuitry 64 and the digital communications bus 74. The digital communications bus 74 is also coupled to the RF system control circuitry 56. As such, the RF system control circuitry 56 provides the envelope power supply control signal VRMP (FIG. 8) and the transmitter configuration signal PACS (FIG. 8) to the transmitter control circuitry 64 via the digital communications bus 74 and the digital communications interface 72.

Figure 10:
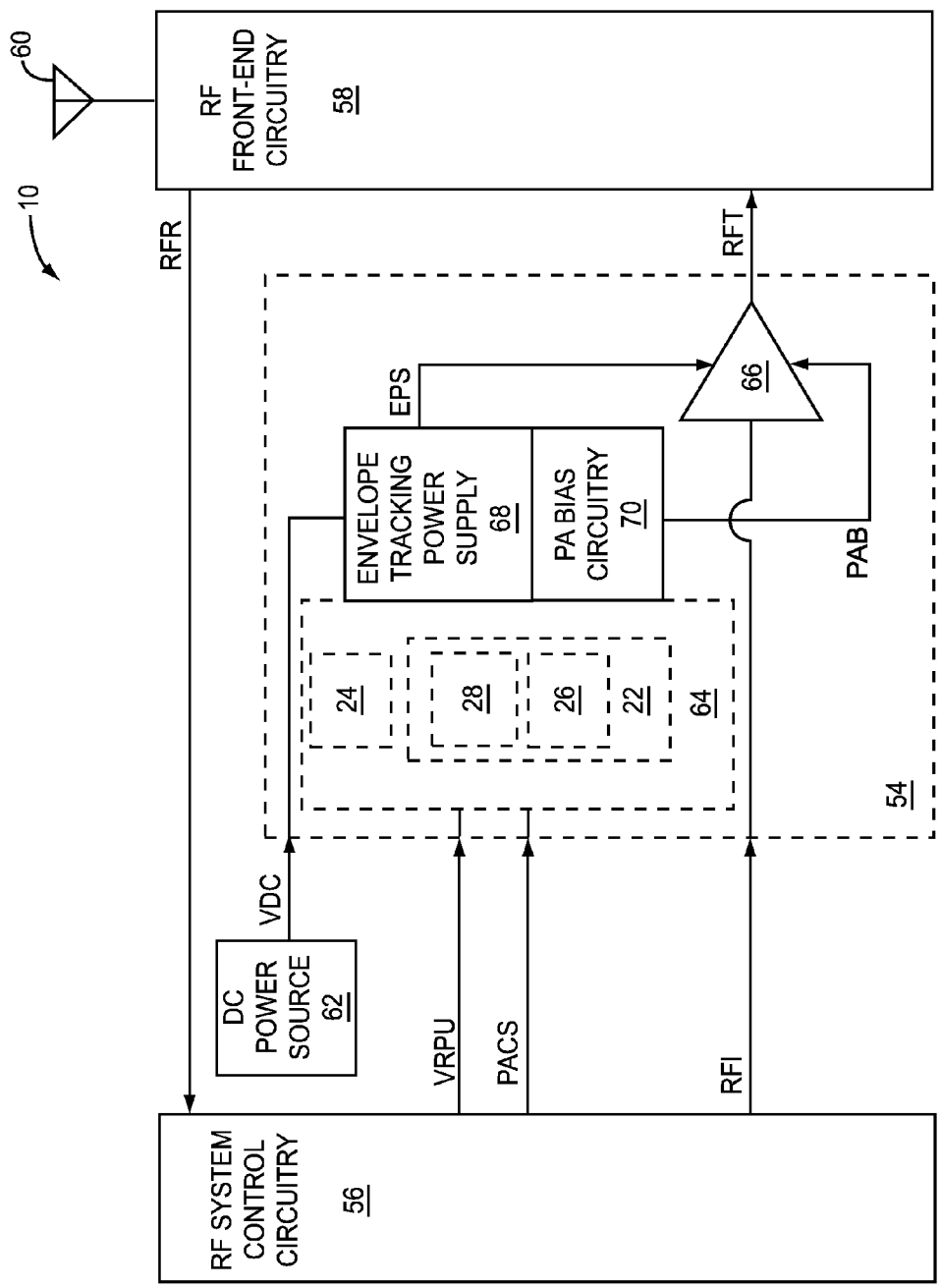
FIG. 10 shows circuitry used in an RF communications system according to a supplemental embodiment of the circuitry.

FIG. 10 shows circuitry 10 used in the RF communications system according to a supplemental embodiment of the circuitry 10. The circuitry 10 illustrated in FIG. 10 is similar to the circuitry 10 illustrated in FIG. 5, except in the circuitry 10 illustrated in FIG. 10, the transmitter control circuitry 64 includes the data memory 22 and the processing circuitry 24. In general, the RF transmitter circuitry 54 includes the data memory 22 and the processing circuitry 24. The data memory 22 includes the LUT-based RF PA calibration data 26 and the monotonic response curve-based data 28. Further, the RF system control circuitry 56 provides an unmodified envelope power supply control signal VRPU to the transmitter control circuitry 64 instead of the envelope power supply control signal VRMP.

The monotonic response curve-based data 28 is based on the monotonic response curve 20 (FIG. 2). In one embodiment of the monotonic response curve-based data 28, the monotonic response curve-based data 28 is LUT-based data. The processing circuitry 24 converts at least a portion of the LUT-based RF PA calibration data 26 to provide the monotonic response curve-based data 28. In one embodiment of the monotonic response curve-based data 28, the monotonic response curve-based data 28 is a pre-distortion of the LUT-based RF PA calibration data 26 to reduce noise on the envelope power supply signal EPS.

The transmitter control circuitry 64 may enhance accurate operation of the RF PA 66 by providing the envelope power supply control signal VRMP (not shown) to the envelope tracking power supply 68 using the monotonic response curve-based data 28, such that a magnitude of the envelope power supply control signal VRMP (not shown) is based on a magnitude of the RF input signal RFI and the unmodified envelope power supply control signal VRPU. The RF transmitter circuitry 54 provides the envelope power supply signal EPS to the RF PA 66 based on the envelope power supply control signal VRMP (not shown). In one embodiment of the circuitry 10, the LUT-based RF PA calibration data 26 is based on operating the RF PA 66 for approximately constant gain operation over an RF power range.

Figure 11:
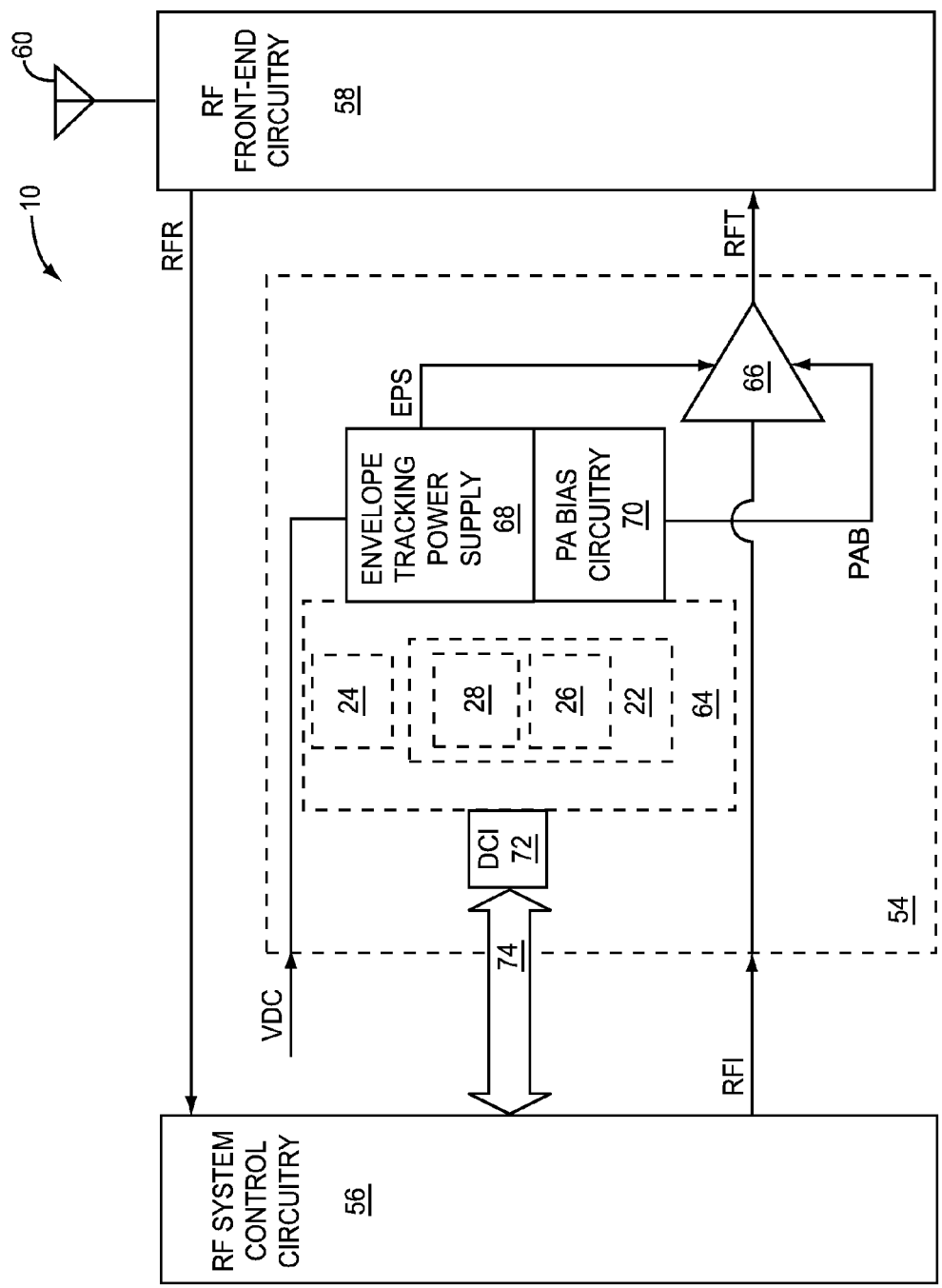
FIG. 11 shows circuitry used in an RF communications system according to one embodiment of the circuitry.

FIG. 11 shows circuitry 10 used in the RF communications system according to one embodiment of the circuitry 10. The circuitry 10 illustrated in FIG. 11 is similar to the circuitry 10 illustrated in FIG. 10, except in the circuitry 10 illustrated in FIG. 11, the RF transmitter circuitry 54 further includes the digital communications interface 72, which is coupled between the transmitter control circuitry 64 and the digital communications bus 74. The digital communications bus 74 is also coupled to the RF system control circuitry 56. As such, the RF system control circuitry 56 provides the unmodified envelope power supply control signal VRPU (FIG. 10) and the transmitter configuration signal PACS (FIG. 10) to the transmitter control circuitry 64 via the digital communications bus 74 and the digital communications interface 72.

Those skilled in the art will recognize improvements and modifications to the embodiments of the present disclosure. All such improvements and modifications are considered within the scope of the concepts disclosed herein and the claims that follow.

What is claimed is:

1. Circuitry comprising:
    data memory adapted to store look-up table (LUT)-based radio frequency (RF) power amplifier (PA) calibration data; and
    processing circuitry adapted to convert at least a portion of the LUT-based RF PA calibration data to provide monotonic response curve-based data, wherein a magnitude of an envelope power supply control signal is based on a magnitude of an RF input signal and using the monotonic response curve-based data, wherein the monotonic response curve-based data is a pre-distortion of the LUT-based RF PA calibration data to reduce noise on an envelope power supply signal, wherein the envelope power supply signal is based on the envelope power supply control signal.

2. Circuitry comprising:
    data memory adapted to store look-up table (LUT)-based radio frequency (RF) power amplifier (PA) calibration data; and
    processing circuitry adapted to convert at least a portion of the LUT-based RF PA calibration data to provide monotonic response curve-based data, wherein a magnitude of an envelope power supply control signal is based on a magnitude of an RF input signal and using the monotonic response curve-based data, wherein the monotonic response curve-based data is based on a high order polynomial interpolation of at least a portion of the LUT-based RF PA calibration data.

3. The circuitry of claim 2 wherein a number of data points used in the high order polynomial interpolation is at least ten times an order of the high order polynomial interpolation.

4. The circuitry of claim 1 wherein the monotonic response curve-based data is LUT-based data.

5. Circuitry comprising:
    data memory adapted to store look-up table (LUT)-based radio frequency (RF) power amplifier (PA) calibration data; and
    processing circuitry adapted to convert at least a portion of the LUT-based RF PA calibration data to provide monotonic response curve-based data, wherein a magnitude of an envelope power supply control signal is based on a magnitude of an RF input signal and using the monotonic response curve-based data, wherein the LUT-based RF PA calibration data is based on calibrating a calibration RF PA for approximately constant gain operation over a calibration RF power range.

6. Circuitry comprising:
    data memory adapted to store look-up table (LUT)-based radio frequency (RF) power amplifier (PA) calibration data; and
    processing circuitry adapted to convert at least a portion of the LUT-based RF PA calibration data to provide monotonic response curve-based data, wherein a magnitude of an envelope power supply control signal is based on a magnitude of an RF input signal and using the monotonic response curve-based data, wherein the monotonic response curve-based data is based on a monotonic response curve that is representative of a calibration envelope power supply signal relative to a calibration RF input signal.

7. The circuitry of claim 6 wherein as an envelope of the calibration RF input signal increases, a magnitude of the calibration envelope power supply signal never decreases.

8. The circuitry of claim 6 wherein a calibration RF PA is adapted to receive and amplify the calibration RF input signal to provide a calibration RF output signal using the calibration envelope power supply signal to provide power for amplification.

9. The circuitry of claim 8 wherein:
    an envelope power supply signal is based on the envelope power supply control signal;
    an RF PA is adapted to receive and amplify the RF input signal to provide an RF transmit signal using the envelope power supply signal to provide the power for amplification; and
    the RF PA is the calibration RF PA.

10. The circuitry of claim 8 wherein:
    an envelope power supply signal is based on the envelope power supply control signal;
    an RF PA is adapted to receive and amplify the RF input signal to provide an RF transmit signal using the envelope power supply signal to provide the power for amplification; and
    the RF PA is not the calibration RF PA.

11. The circuitry of claim 1 further comprising RF calibration circuitry, which comprises the data memory and the processing circuitry.

12. The circuitry of claim 11 wherein RF system control circuitry is adapted to provide the envelope power supply control signal based on the magnitude of the RF input signal using the monotonic response curve-based data.

13. The circuitry of claim 12 wherein the RF system control circuitry is further adapted to provide the RF input signal.

14. The circuitry of claim 12 wherein the RF system control circuitry is further adapted to provide the envelope power supply control signal via a digital communications bus.

15. The circuitry of claim 1 further comprising RF system control circuitry, which comprises the data memory and the processing circuitry.

16. The circuitry of claim 15 wherein the RF system control circuitry is adapted to provide the envelope power supply control signal based on the magnitude of the RF input signal using the monotonic response curve-based data.

17. The circuitry of claim 16 wherein the RF system control circuitry is further adapted to provide the RF input signal.

18. The circuitry of claim 16 wherein the RF system control circuitry is further adapted to provide the envelope power supply control signal via a digital communications bus.

19. The circuitry of claim 1 further comprising RF transmitter circuitry, which comprises the data memory and the processing circuitry.

20. The circuitry of claim 19 wherein the RF transmitter circuitry is adapted to provide the envelope power supply signal based on the envelope power supply control signal.

21. The circuitry of claim 20 wherein the RF transmitter circuitry comprises an RF PA adapted to receive and amplify the RF input signal to provide an RF transmit signal using the envelope power supply signal to provide power for amplification.

22. The circuitry of claim 19 wherein the RF transmitter circuitry is further adapted to receive an unmodified envelope power supply control signal via a digital communications bus.

23. A method comprising:
    storing look-up table (LUT)-based radio frequency (RF) power amplifier (PA) calibration data; and
    converting at least a portion of the LUT-based RF PA calibration data to provide monotonic response curve-based data, wherein a magnitude of an envelope power supply control signal is based on a magnitude of an RF input signal and using the monotonic response curve-based data, wherein the monotonic response curve-based data is a pre-distortion of the LUT-based RF PA calibration data to reduce noise on an envelope power supply signal, wherein the envelope power supply signal is based on the envelope power supply control signal.

* * * * *